United States Patent [19]
Ogure et al.

[11] Patent Number: 5,630,881
[45] Date of Patent: May 20, 1997

[54] THIN-FILM FORMING APPARATUS WITH MAGNETIC BEARINGS AND A NON-CONTACT SEAL AND DRIVE

[75] Inventors: Naoaki Ogure, Tokyo; Yoichi Kanemitsu, Kanagawa-ken, both of Japan

[73] Assignee: Ebara Corporation, Tokyo, Japan

[21] Appl. No.: 289,215

[22] Filed: Aug. 12, 1994

[30] Foreign Application Priority Data

Aug. 16, 1993 [JP] Japan ................... 5-223845

[51] Int. Cl.$^6$ .................................................. C23C 16/00
[52] U.S. Cl. .................. 118/730; 118/725; 118/733
[58] Field of Search ........................... 118/715, 725, 118/728, 730, 733

[56] References Cited

U.S. PATENT DOCUMENTS

| | | | |
|---|---|---|---|
| 4,881,722 | 11/1989 | Koizumi | 266/176 |
| 4,980,204 | 12/1990 | Fujii | 427/255.2 |
| 4,986,216 | 1/1991 | Ohmori | 118/730 |
| 4,997,677 | 3/1991 | Wang et al. | 427/248.1 |
| 5,021,697 | 6/1991 | Kralick | 310/90.5 |
| 5,076,877 | 12/1991 | Ueda et al. | 156/345 |
| 5,111,102 | 5/1992 | Meeks | 310/90.5 |
| 5,216,308 | 6/1993 | Meeks | 310/90.5 |
| 5,237,229 | 8/1993 | Ohishi | 310/90.5 |
| 5,302,209 | 4/1994 | Maeda | 118/719 |
| 5,338,940 | 8/1994 | Takeyama | 250/492.2 |
| 5,339,539 | 8/1994 | Shiraishi | 34/58 |

FOREIGN PATENT DOCUMENTS

WO93/25722  12/1993  WIPO.

OTHER PUBLICATIONS

"An Analytical Study of the Chemical Vapor Deposition (CVD) Processes in a Rotating Pedestal Reactor", *Journal of Crystal Growth* 77, (1986), pp. 199–208, North–Holland, Amsterdam.

*Primary Examiner*—Richard Bueker
*Assistant Examiner*—Jeffrie R. Lund
*Attorney, Agent, or Firm*—Armstrong, Westerman, Hattori, McLeland & Naughton

[57] ABSTRACT

A thin-film forming device including a reaction chamber having an atmosphere different from that in the outside world, a susceptor rotatably disposed in the reaction chamber for mounting a substrate thereon to form a thin film thereon, and a nozzle disposed within the reaction chamber facing the susceptor for supplying a thin-film forming material on the substrate, the thin-film forming device comprises: a levitating means including magnetic bearings for non-contact support of the susceptor; and a driving means for rotating the susceptor at high speed, to thereby increase the rotational speed of the susceptor and the thin-film forming rate.

18 Claims, 2 Drawing Sheets

THIN-FILM FORMING APPARATUS WITH MAGNETIC BEARINGS AND A NON-CONTACT SEAL AND DRIVE

BACKGROUND OF THE INVENTION

1. Field of the Invention

The present invention relates to a thin-film forming device for forming a thin film, e.g., an insulating film, a metal film, etc., on the surface of a substrate, for example, a semiconductor wafer, for various purposes.

2. Prior Art

There has heretofore been developed a thin-film forming device of the type described above, which has a mechanism for rotating a susceptor having, for example, a semiconductor wafer mounted thereon in a reaction chamber during formation of an insulating film on the semiconductor wafer in order to level the distribution of film thickness on the wafer surface to form an even film. With this thin-film forming device, film growth is carried out with the wafer being rotated at a peripheral velocity higher than the linear velocity of a gas supplied to the reaction chamber, thereby making it possible to form a thin film, e.g., $SiO_2$, which has a sufficiently uniform film thickness distribution. It has been known that in the above-described thin-film forming system, as the wafer rotating speed is raised, the uniformity of the film thickness improves, and the average film growth rate also increases.

In the above-described conventional thin-film forming device, the rotational speed cannot always be increased as desired because it employs contact type seal mechanism and bearings. Accordingly, it has heretofore been impossible to raise the film growth rate to a satisfactorily high level and to form an even thin film because of the limitation in capability of the device.

In view of the above-described circumstances, it is an object of the present invention to provide a thin-film forming device capable of forming a thin film of uniform thickness on a substrate, a semiconductor wafer, for example, at high speed.

SUMMARY OF THE INVENTION

To solve the above-described problems, the present invention provides a thin-film forming device comprising a reaction chamber having an atmosphere different from that in the outside world, a susceptor rotatably disposed in the reaction chamber for mounting a substrate thereon to form a thin film thereon, and a nozzle disposed within the reaction chamber facing the susceptor for supplying a thin-film forming material on the substrate. The thin-film forming device comprises a levitating means including magnetic bearings for non-contact support of the susceptor, and a driving means for rotating the susceptor at high speed.

In the thin-film forming device having the above-described arrangement, the susceptor having a substrate mounted thereon is non-contactingly supported by the levitating means. In other words, no contact type bearing is used to suspend or support the rotator. Therefore, the rotational speed of the susceptor can be increased as desired within the limits allowed by the strength of the rotator. It is known that the film growth rate is generally proportional to the square root of the wafer rotating speed, provided that the pressure of gas supplied to the reaction chamber and the raw material feed rate are constant. It is considered that the linear velocity of gas supplied to a CVD system is 100 m/s, for example, although it depends on the specifications of the system.

Meantime, it is necessary to rotate the susceptor at 16,000 rpm in order to rotate a 5-inch wafer, which has a diameter of 125 mm, at a peripheral velocity of 100 m/s. It has been extremely difficult or impossible to maintain the above rotational speed in a conventional device using rolling bearings from the viewpoint of lubrication, vibration and durability. However, such a rotational speed of the susceptor can be realized without any problem in the thin-film forming device of the present invention, which has a levitating means using magnetic bearings. Accordingly, the thin-film forming device of the present invention enables a thin film of uniform thickness to be formed at high speed.

Preferably, the thin-film forming device of the invention comprises a rotary shaft connected to the susceptor and a casing connected to the reaction chamber for accommodating the rotary shaft therein, and the levitating means comprises a pair of up and downwardly spaced radial magnetic bearings and a thrust magnetic bearing which are provided between the rotary shaft and the casing.

A non-contact shaft seal means, such as a labyrinth seal or a screw seal, may be provided between the reaction chamber and the casing to maintain a pressure difference between the inside of the reaction chamber and the inside of the casing. By this arrangement, the reaction chamber, which is normally kept under low pressure or vacuum condition, is isolated from relatively high pressure in the casing to thereby keep the reaction chamber in clean condition.

The driving means may be a non-contacting type one such as an AC induction motor, a brushless DC motor or a non-contact magnetic coupling provided between said rotary shaft and said casing.

A power supplying means may be provided in the thin-film forming device for supplying power to a heater embedded in the susceptor for heating the substrate mounted thereon and/or to an electrostatic chuck for holding the substrate on the susceptor. The power supplying means may be a power generating means which comprises a power generating coil, an induction coil, a transformer or an eddy-current generating means provided in the rotary shaft. Instead, the power supplying means may comprise a solid sliding type slip ring or a mercury slip ring provided between the rotary shaft and the casing for introducing a power from outside.

In order to cool the levitating means, the driving means and the power supplying means provided in the casing, a cooling gas inlet port and the outlet port may be provided in the casing for passing a cooling gas through the space between the casing and the rotary shaft. Preferably, a ceramic material is used for a member for covering and/or securing a conductor wire used in the driving means, levitating means and power supplying means to increase heat resistance.

The above and other objects, features and advantages of the present invention will become more apparent from the following description when taken in conjunction with the accompanying drawings in which a preferred embodiment of the present invention is shown by way of illustrative examples.

PREFERRED EMBODIMENT OF THE INVENTION

Figure 1:
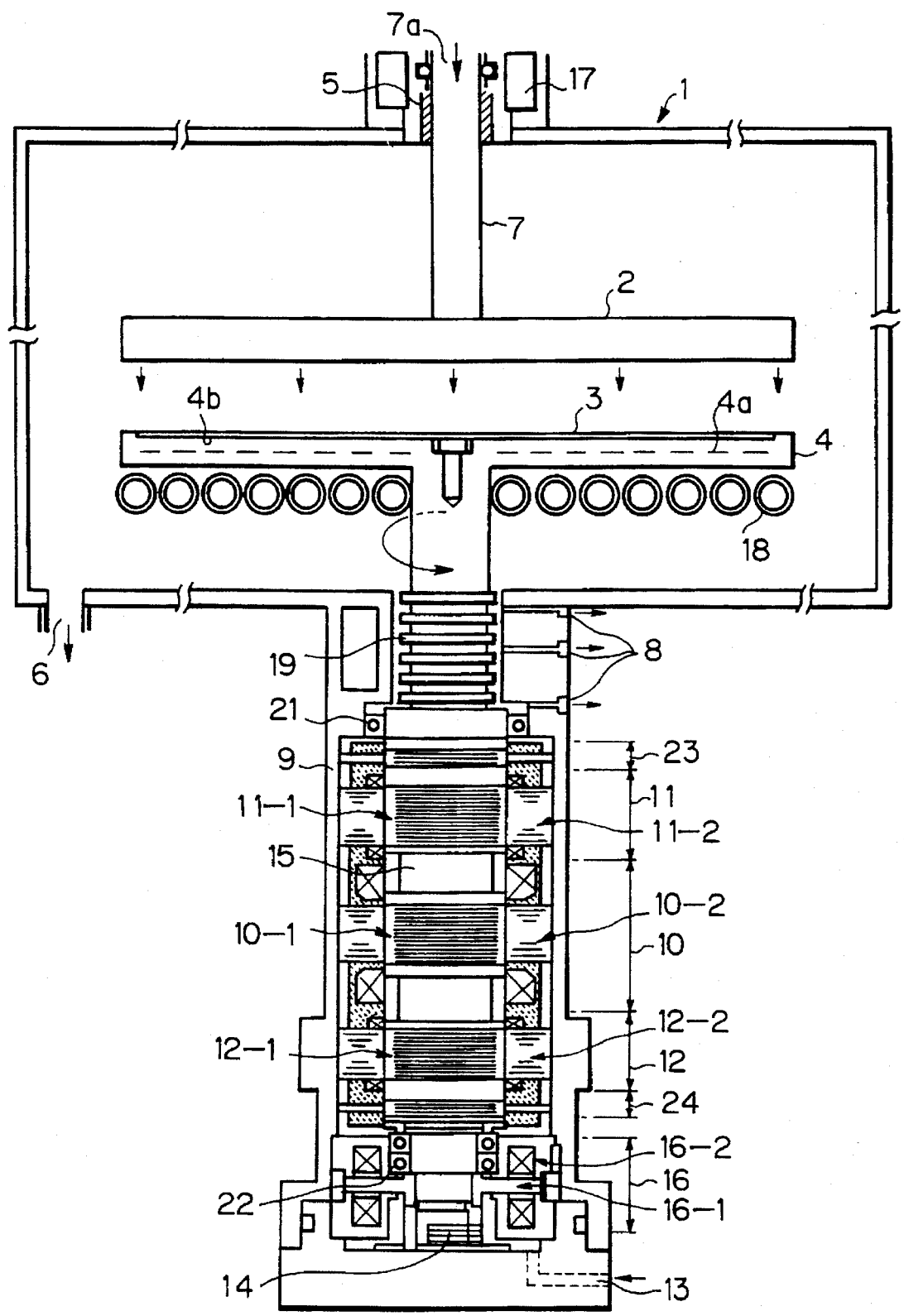
FIG. 1 shows the structure of the thin-film forming device according to the present invention.

One embodiment of the present invention will be described below with reference to the accompanying drawings. FIG. 1 shows the structure of the thin-film forming device according to the present invention. In FIG. 1, reference numeral 1 denotes a reaction chamber, in which is disposed the rotary susceptor 4 for mounting the wafer 3 to form a thin film thereon. The upper nozzle 2 is disposed to face the rotary susceptor 4. A gas feed pipe 7 is connected to the upper nozzle 2. When a gas for film growth is supplied from the gas feed opening 7a, the gas is uniformly jetted out from the lower side of the upper nozzle 2 toward the surface of the wafer 3. The rotary susceptor 4 is levitated by a levitating means having magnetic bearings and rotated at high speed by a driving means, as described later in detail.

The inside of the rotary susceptor 4 is provided with a heater 4a for heating and an electrostatic chuck mechanism 4b for securing the wafer 3. Further, the reaction chamber 1 is provided with an exhaust opening 6, which is connected to a vacuum pump (not shown) to create a desired vacuum condition in the reaction chamber 1. In addition, the heat-resisting insulator 5 is interposed between the gas feed pipe 7 and the wall of the reaction chamber 1, and the cooling jacket 17 is provided around the outer periphery of the upper part of the gas feed pipe 7 to cool the gas feed pipe 7. It should be noted that it is also possible to use a mechanical chuck that utilizes a spring, for example, in place of the electrostatic chuck for securing the wafer 3.

The rotary susceptor 4 is coupled to the rotating shaft 15. The rotating shaft 15 is levitatively supported without contacting a surrounding stationary member not only when the rotating shaft 15 is rotating but also when it is suspended by a levitating means which is composed of two, upper and lower, radial magnetic bearings 11 and 12 and one thrust magnetic bearing 16. The upper radial magnetic bearing 11 is composed of a core 11-1 which is secured to the rotating shaft 15, and an electromagnet 11-2 which is secured to the driving bearing casing 9. The lower radial magnetic bearing 12 is composed of the core 12-1 which is secured to the rotating shaft 15, and an electromagnet 12-2 which is secured to the driving bearing casing 9.

Reference numerals 23 and 24 denote radial gap sensors for detecting a displacement of the rotating shaft 15. The magnetic forces of the electromagnets 11-2 and 12-2 are controlled on the basis of the outputs of the radial gap sensors 23 and 24 so that the axis of the rotating shaft 15 is always coincident with the mutual center axis of the electromagnets 11-2 and 12-2. The thrust magnetic bearing 16 is composed of a disk 16-1 which is secured to the rotating shaft 15, and an electromagnet 16-2 faced to both sides of the disk 16-1 and secured to the casing 9. The magnetic force of the electromagnet 16-2 is controlled by detecting a displacement of the disk 16-1 with a thrust sensor (not shown), thereby controlling the position of the thrust magnetic bearing 16 in the thrust direction to a predetermined position. It should be noted that the structures of the upper and lower radial magnetic bearings 11 and 12 and the thrust magnetic bearing 16 are not necessarily limited to the above-described structures.

Reference numeral 10 denotes an induction motor for driving the rotating shaft 15. The induction motor 10 is composed of a rotor core 10-1 which is secured to the rotating shaft 15, and a stator 10-2 which is secured to the driving bearing casing 9. It should be noted that reference numerals 21 and 22 denote emergency ball bearings.

The portion of the rotating shaft 15 which lies in the border between the inside of the reaction chamber 1 and the inside of the driving bearing casing 9 is provided with the non-contact shaft seal 19 such as a labyrinth seal or screw seal, thereby making it possible to maintain a pressure difference between the inside of the reaction chamber 1 which is under a low-pressure (vacuum) condition and the inside of the driving bearing casing 9 which is under a relatively high-pressure (atmospheric pressure) condition. The driving bearing casing 9 is also formed as a cooling housing in which the cooling gas feed opening 13 is provided in the lower end portion thereof, and the cooling gas outlet ports 8 are provided in the outer peripheral portion thereof which lies around the labyrinth or screw seal 19. A cooling gas, e.g., Ar, $N_2$, He, etc., is supplied from the cooling gas feed opening 13. The cooling gas flows inside the driving bearing casing 9, passing through the upper and lower radial magnetic bearings 11 and 12 and through the gap between the stator 10-2 of the induction motor 10 and the rotating shaft 15, and is discharged from the cooling gas outlet ports 8. Since heat is conducted to the rotating shaft 15 from the rotary susceptor 4 which is held at a high temperature for film growth, the heat is taken away by the cooling gas, thereby preventing an excessive rise in the temperature of the rotating shaft 15.

The lower end of the rotating shaft 15 is provided with a slip ring 14 for supplying a part of electric power to the heater 4a and the electrostatic chuck mechanism 4b, which are provided in the rotary susceptor 4. The central portion of the rotating shaft 15 is provided with an axial hollow, in which lead wires (not shown) are disposed for supplying electric power to the rotary susceptor 4. As the required electric power is supplied from an external power source through the slip ring 14, the current is supplied to the heater 4a and the electrostatic chuck mechanism 4b through the lead wires. It should be noted that the supply of electric power can also be effected in a contact or non-contact manner by making use of the mercury slip ring or electromagnetic induction obtained by incorporating a coil for power generation, an induction coil, a transformer, or an eddy-current mechanism in the rotating shaft 15 and the surrounding stationary member, instead of the slip ring 14. In this embodiment, a deficiency in the quantity of heat is given to the rotary susceptor 4 in the form of an eddy current from the induction coil 18 which is provided directly under the rotary susceptor 4.

Although in the above-described embodiment the induction motor 10 is used as the driving part of the driving means, it should be noted that the driving part is not necessarily limited to the induction motor 10, and that it is possible to use any device that transmits driving force in a non-contact manner, such as a brushless DC motor or a non-contact magnetic coupling.

From the viewpoint of heat resistance, a ceramic material is suitably used for a member for covering and/or securing a conductor wire used in at least a part of the driving means including the induction motor 10, the levitating means, which is includes the upper and lower radial magnetic bearings 11 and 12 and the thrust magnetic bearing 16, and the current generating means.

In the thin-film forming device having the above-described structure, the rotary susceptor 4 is rotated at high speed by rotating the rotating shaft 15 with the induction motor 10, while the gas for film growth is supplied from the gas feed pipe 7 of the upper nozzle 2 and the gas is jetted out from the upper nozzle 2 toward the surface of the wafer 3 mounted on the rotary susceptor 4, thereby enabling a thin film to be formed on the upper surface of the wafer 3.

Figure 2:
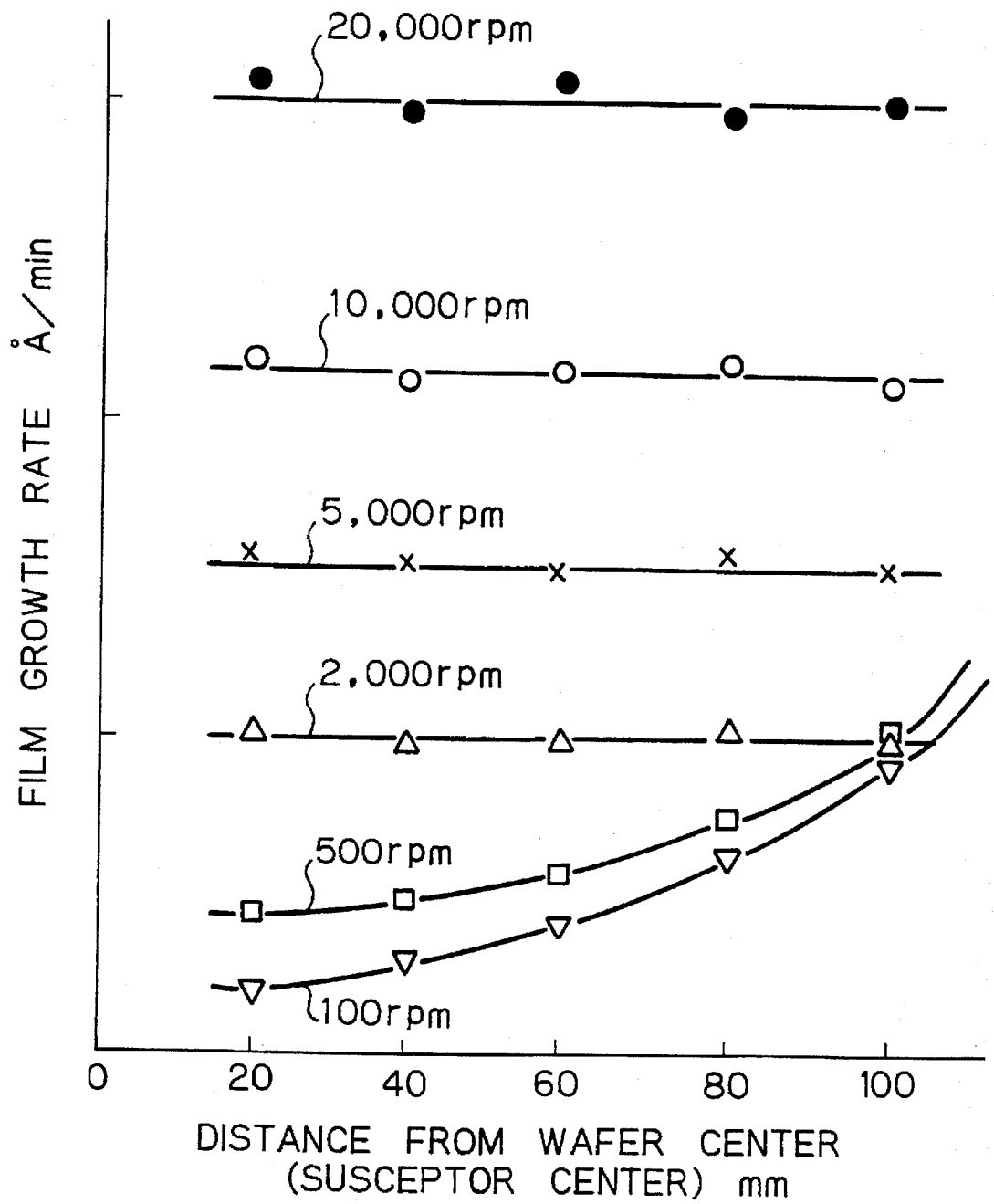
FIG. 2 is a graph showing the results of the measurement of the rate of film growth carried out by using the thin-film forming device of the present invention.

FIG. 2 shows the results of film growth on the surface of the wafer 3 in a case where, in the device of the above-described embodiment, a mixed gas of $O_3$ and TEOS {tetra ethyl ortho silicate: $Si(OC_2H_5)_4$} was supplied at a linear velocity of 1 m/s from the upper nozzle 2 under the conditions that the radius of the rotary susceptor 4 was 110 mm; the diameter of the wafer 3 was 8 inches; the number of revolutions of the wafer 3 was varied in the range of 100 rpm to 20,000 rpm; the temperature of the wafer 3 was 390° C.; and the pressure in the reaction chamber 1 was 30 torr. In the figure, the abscissa axis represents the distance from the center of the wafer 3 (i.e., the center of the rotary susceptor 4), and the ordinate axis represents the film growth rate (Å/min).

As shown in FIG. 2, when the rotational speed of the rotary susceptor 4 is 2,000 rpm or higher, a thin $SiO_2$ film can be formed at a uniform rate and with a uniform thickness on the surface of the wafer 3. The film growth rate increases as the number of revolutions becomes higher.

As has been described above, it is possible according to the present invention to provide a thin-film forming device capable of growing a film of uniform thickness on the whole surface of the substrate at high speed by levitating the susceptor with a levitating means having magnetic bearings and rotating the susceptor at high speed in the levitated state.

What is claimed is:

1. A thin-film forming device including a reaction chamber having an atmosphere different from that externally thereof, a susceptor rotatably disposed in said reaction chamber for mounting a substrate thereon to form a thin film thereon, and a nozzle disposed within said reaction chamber facing said susceptor for supplying a thin-film forming material on said substrate, said thin-film forming device comprising:

a levitating means including magnetic bearings for non-contact support of said susceptor; and a driving means for rotating said susceptor at a speed in a range above 2,000 rpm, in order to improve the radial uniformity of the deposited layer.

2. A thin-film forming device according to claim 1, further comprising a rotary shaft connected to said susceptor and a casing connected to said reaction chamber for accommodating said rotary shaft therein, wherein said levitating means comprising a pair of up and downwardly spaced radial magnetic bearings and a thrust magnetic bearing provided between said rotary shaft and said casing.

3. A thin-film forming device according to claim 2, further comprising a non-contact shaft seal means provided between said reaction chamber and said casing to maintain a pressure difference between the inside of said reaction chamber and the inside of said casing.

4. A thin-film forming device according to claim 3, wherein said non-contact shaft seal means comprises a labyrinth seal or a screw seal.

5. A thin-film forming device according to any one of claims 2 to 4, wherein said driving means comprises an AC induction motor, a brushless DC motor or a non-contact magnetic coupling provided between said rotary shaft and said casing.

6. A thin-film forming device according to any one of claims 2 to 4, wherein a heater is embedded in said susceptor for heating said substrate and said device further comprises power supplying means connected to said heater.

7. A thin-film forming device according to claim 6, wherein said power supplying means comprises power generating means including a power generating coil, an induction coil, a transformer or an eddy-current generating means provided in said rotary shaft.

8. A thin-film forming device according to claim 6, wherein said power supplying means comprises a solid sliding type slip ring or a mercury slip ring provided between said rotary shaft and said casing.

9. A thin-film forming device according to any one of claims 2 to 4, further comprising cooling gas inlet and outlet ports provided in said casing for passing a cooling gas through a space between said casing and said rotary shaft.

10. A thin-film forming device according to any one of claims 2 to 4, wherein a ceramic material is used for a member for covering and/or securing a conductor wire used in at least a part of said driving means, levitating means and/or current supplying means.

11. A thin-film forming device according to any one of claims 2 to 4, wherein said substrate is a semiconductor wafer.

12. A thin-film forming device according to any one of claims 2 to 4, wherein said thin-film is an insulating film or a metal film.

13. A thin-film forming device according to any one of claims 2 to 4, wherein the rotating speed of said susceptor driven by said driving means is higher than 2000 rpm.

14. A thin-film forming device according to claim 1, wherein a heater is embedded in said susceptor for heating said substrate and said device further comprises power supplying means connected to said heater.

15. A thin-film forming device according to claim 1, wherein a ceramic material is used for a member for covering and/or securing a conductor wire used in at least a part of said driving means, levitating means and/or current supplying means.

16. A thin-film forming device according to claim 1, wherein said substrate is a semiconductor wafer.

17. A thin-film forming device according to claim 1, wherein said thin-film is an insulating film or a metal film.

18. A thin-film forming device according to claim 1, wherein the rotating speed of said susceptor driven by said driving means is higher than 2000 rpm.

* * * * *